United States Patent [19]

Kataoka et al.

[11] Patent Number: 4,800,151
[45] Date of Patent: Jan. 24, 1989

[54] RADIATION-SENSITIVE POSITIVE RESIST COMPRISING A FLUORINE-CONTAINING ALPHA-CHLOROACETATE COPOLYMER IN THE SPECIFICATION

[75] Inventors: Mutsuo Kataoka; Atuto Tokunaga, both of Ohtsu, Japan

[73] Assignee: Toray Industries, Inc., Tokyo, Japan

[21] Appl. No.: 28,428

[22] Filed: Mar. 20, 1987

[30] Foreign Application Priority Data

Mar. 26, 1986 [JP] Japan .................................. 61-65898

[51] Int. Cl.$^4$ .................... G03C 5/24; G03C 1/495
[52] U.S. Cl. .................................... 430/270; 430/296; 430/966; 430/942; 526/245
[58] Field of Search ............... 430/270, 296, 966, 942; 526/245

[56] References Cited

U.S. PATENT DOCUMENTS

| | | | |
|---|---|---|---|
| 3,425,867 | 2/1969 | Stillo | 430/296 |
| 4,259,407 | 3/1981 | Tada et al. | 428/421 |
| 4,268,590 | 5/1981 | Eranian et al. | 430/296 X |
| 4,454,222 | 6/1984 | Tada et al. | 430/270 X |
| 4,518,675 | 5/1985 | Kataoka | 430/256 |
| 4,539,250 | 9/1985 | Fujii et al. | 430/270 X |

FOREIGN PATENT DOCUMENTS

| | | | |
|---|---|---|---|
| 57969 | 1/1952 | Japan . | |
| 60-8842 | 1/1985 | Japan | 430/270 |
| 60-67941 | 4/1985 | Japan | 430/296 |
| 60-260036 | 12/1985 | Japan | 430/270 |
| 60-260040 | 12/1985 | Japan | 430/270 |
| 60-260037 | 12/1985 | Japan | 430/270 |

OTHER PUBLICATIONS

Tsukasa; Tada, "Poly(Trifluorethyl α-Chloroacrylate) as a Highly Sensitive Positive Electron Resist", *Journal of Electrochemical Society: Accelerated Brief Communication*, vol. 126, Nov. 1979, pp. 1829-1830.

Primary Examiner—Paul R. Michl
Assistant Examiner—Cynthia Hamilton
Attorney, Agent, or Firm—Armstrong, Nikaido, Marmelstein & Kubovcik

[57] ABSTRACT

The present invention relates to a radiation-sensitive positive resist comprising a copolymer obtained by copolymerizing 2,2,2-trifluoroethyl α-chloroacrylate with 2,2,3,3-tetrafluoropropyl α-chloroacrylate at a weight ratio of between 90:10 and 50:50 and a radiation-sensitive positive resist composition essentially comprising said copolymer and a solvent containing methyl cellosolve acetate as a major component. The resist and the resist composition according to the present invention exhibit high sensitivity and excellent reproducibility, so that they are useful in the production of a photo mask which is used in the production of LSI, VLSI and the like.

15 Claims, 1 Drawing Sheet

RADIATION-SENSITIVE POSITIVE RESIST COMPRISING A FLUORINE-CONTAINING ALPHA-CHLOROACETATE COPOLYMER IN THE SPECIFICATION

BACKGROUND OF THE INVENTION (1) Field of the Invention

The present invention relates to a radiation-sensitive positive resist and a composition containing the same which are used in the production of LSI, VLSI or the like. Particularly, it relates to a radiation-sensitive positive resist and a composition containing the same which are favorably used in the production of photo masks by wet etching.

(2) Description of the Prior Art

PBS (poly-1-butenesulfone), "EBR-9" (poly-2,2,2-trifluoroethyl α-chloroacrylate: a product of Toray Industries, Inc.), PMMA (polymethyl methacrylate) and the like have been used as a radiation-sensitive positive resist.

Further, several copolymers of 2,2,2-trifluoroethyl α-chloroacrylate and other fluoroalkyl α-chloroacrylates have been proposed. For example, a copolymer comprising 2,2,2-trifluoroethyl α-chloroacrylate and heptafluorobutyl α-acrylate with a ratio of 60 to 40 is disclosed in Japanese Patent Publication No. 969/1982, while a copolymer comprising 2,2,2-trifluoroethyl α-chloroacrylate and 1,1-dimethylheptafluorobutyl α-chloroacrylate with a ratio of 60 to 40 is disclosed in U.S. Pat. No. 4,259,407.

Although PMMA has long been used as an electron beam-sensitive positive resist, it exhibits too poor a sensitivity to be used in the production of photo masks with an electron beam exposure system, thus being problematic in productivity.

PBS has been widely used in the production of photo masks. However, the sensitivity of PBS significantly varies depending upon development conditions such as temperature or humidity. Therefore, PBS exhibits so poor reproducibility that it is difficult to obtain photo masks in a high yield.

On the contrary, EBR-9 is free from the above disadvantages and exhibits excellent processing stability and reproducibility. However, it has a disadvantage of low sensitivity.

The above copolymers of 2,2,2-trifluoroethyl α-chloroacrylate with heptafluorobutyl α-chloroacrylate or the like could not also exhibit sufficiently high sensitivity, though the sensitivity thereof was enhanced to some extent.

The most suitable application of a radiation-sensitive positive resist is in the production of photo masks by wet etching. When the above copolymer of the prior art is applied on chromium blanks, subjected to pattern exposure with an electron beam exposure system and developed, the obtained resist pattern does not exhibit sufficient adhesion to chromium, so that the pattern tends to peel off, if the size thereof is less than 1μ, and significant swelling of the resist pattern is observed.

Furthermore, when the polymer of the prior art is subjected to wet etching with an etchant, it is poor in adhesion to result in serious side etch.

SUMMARY OF THE INVENTION

The present invention has been made in view of the above disadvantages of the prior art and an object thereof is to provide a radiation-sensitive positive resist and a composition containing the same which are excellent in processing stability and reproducibility and exhibits high sensitivity.

The present invention relates to a radiation-sensitive positive resist comprising a copolymer obtained by copolymerizing 2,2,2-trifluoroethyl α-chloroacrylate with 2,2,3,3-tetrafluoropropyl α-chloroacrylate at a weight ratio of between 90:10 and 50:50 and a radiation-sensitive positive resist composition essentially comprising a copolymer obtained by copolymerizing 2,2,2-trifluoroethyl α-chloroacrylate with 2,2,3,3-tetrafluoropropyl α-chloroacrylate at a weight ratio of between 90:10 and 50:50 and a solvent mixture mainly comprising methyl cellosolve acetate as a major component.

DESCRIPTION OF THE PREFERRED EMBODIMENTS

Figure 1:
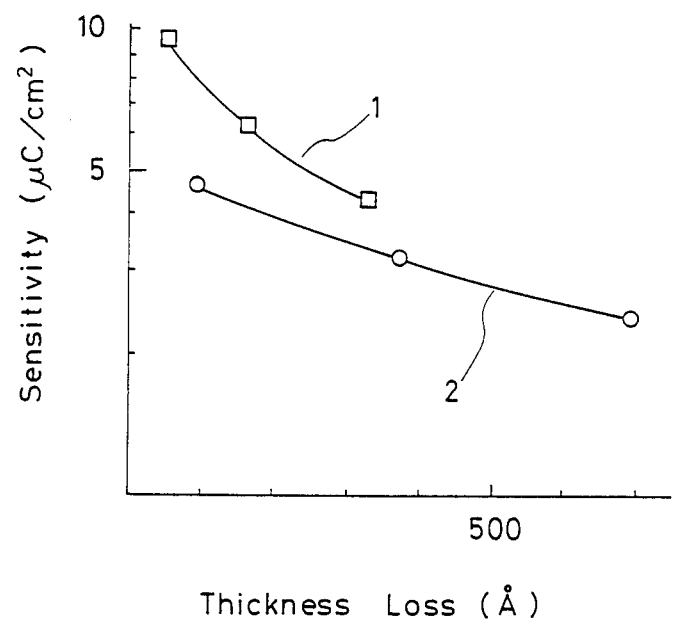
FIG. 1 is a graph showing the relationship between sensitivity and thickness loss in the case wherein EBR-9 is developed with methyl isobutyl ketone alone or with a mixture of methyl isobutyl ketone and isopropanol.

An essential feature of the present invention is to use 2,2,3,3-tetrafluoropropyl α-chloroacrylate as the monomer to be copolymerized with 2,2,2-trifluoroethyl α-chloroacrylate.

The proportion of 2,2,3,3-tetrafluoropropyl α-chloroacrylate based on the whole monomer components is preferably at least 10% by weight, still preferably at least 20% by weight to attain a sensitivity higher than that of EBR-9.

If the proportion of 2,2,3,3-tetrafluoropropyl α-chloroacrylate exceeds 50% by weight, the resulting copolymer will exhibit a lowered adhesion to chromium blanks. Therefore, this proportion is more preferably less than 40% by weight.

Accordingly, the proportion of 2,2,2-trifluoroethyl α-chloroacrylate based on the whole monomer components is preferably 50 to 90% by weight.

The intrinsic viscosity of a copolymer, which depends upon the molecular weight, is a factor which affects the performance of a resist comprising said copolymer.

According to the present invention, the intrinsic viscosity of the copolymer as determined in methyl ethyl ketone at 25° C. is preferably 0.5 to 2.0, still preferably 1.0 to 1.5. Generally, the higher the intrinsic viscosity (i.e., the molecular weight), the higher the sensitivity. However, it is preferable in view of filtration behavior and film formability that the intrinsic viscosity does not exceed 2.0. When the copolymer has an intrinsic viscosity falling in the above range, it can form an excellent resist film.

As will be described below, the resist of the present invention is preferably used as a resist solution (i.e., resist composition) obtained by dissolving the resist in a solvent (mixture) comprising methyl cellosolve acetate (hereinafter referred to merely as "MCA") as a major component. The viscosity of this solution can not be determined based on the above intrinsic viscosity only. A resist composition excellent in filtration behavior and film formability can be obtained by controlling the viscosity of the solution to a suitable one.

According to the present invention, the viscosity (determined at 25° C.) of a 5% solution of the copolymer in MCA is preferably 20 to 70 cP, still preferably 30 to 60 cP.

The solvent to be used for dissolving the copolymer according to the present invention is preferably MCA alone or a solvent mixture containing MCA as a major component, though not particularly limited. The solvent mixture is preferably a mixture containing at least 70% by weight of MCA.

Examples of the solvent to be used as a mixture with MCA include esters such as methyl acetate, ethyl acetate, isopropyl acetate, propyl acetate, butyl acetate and isobutyl acetate and ketones such as methyl isobutyl ketone, methyl isoamyl ketone and cyclohexanone.

A solution of the copolymer of the present invention in a mixture comprising not less than 70% by weight of MCA and not more than 30% by weight of a lower alcohol having 1 to 3 carbon atoms, preferably methanol, exhibits a viscosity lower than that of a solution thereof in MCA alone having the same polymer concentration, thus forming a uniform and better coating film. The amount of methanol is still preferably 5 to 20% by weight. If the amount is less than 5% by weight, there will be little effect, while if it exceeds 30% by weight, the resulting solution will show a higher viscosity.

As described above, the resist of the present invention is generally used as a resist solution. It is preferred in order to preserve the resist solution for a long period of time without causing any changes that a radical inhibitor is added to the resist solution comprising the 2,2,2-trifluoroethyl α-chloroacrylate copolymer and a solvent mixture containing MCA as a major component.

When a radical inhibitor is added to the resist solution, the resulting solution can be stably preserved without causing any changes in viscosity for a long period of time, for example, for at least one year at room temperature or for at least 2 months even at 50° C.

Although the radical inhibitor to be used in the present invention may be any one which is stable at room temperature, it is preferable that the radical inhibitor has a molecular weight of 600 or below. That is to say, it is preferable that the radical inhibitor is one which can be vaporized off by prebaking the resist applied on a substrate by spin coating at 160° to 200° C. If a radical inhibitor remains intact in the resist film after prebaking, the radical inhibitor will separate out as particles in the resist film or reduce the sensitivity of the resist film.

Examples of the radical inhibitor to be used in the present invention include stable radicals such as tri-p-nitrophenylmethyl, diphenylpicrylhydrazyl and galvinoxyl; quinones such as benzoquinone, chlorobenzoquinone, 2,5-dichlorobenzoquinone, 2,3-dimethylbenzoquinone, 2,5-dimethylbenzoquinone, methoxybenzoquinone, methylbenzoquinone, tetrabromobenzoquinone, tetrachlorobenzoquinone, tetramethylbenzoquinone, trichlorobenzoquinone and trimethylbenzoquinone; naphthols such as α-naphthol, 2-nitro-1-naphthol, β-naphthol and 1-nitro-2-naphthol; phenols such as hydroquinone, catechol, resorcinol, o-t-butylphenol, p-methoxyphenol, p-ethoxyphenol, 2,6-di-t-butyl-p-cresol, 2,6-di-t-butylphenol, 2,4-di-t-butylphenol, 3,5-di-t-butylphenol, 3,5-di-t-butylcatechol, 3,5-di-t-butyl-4-hydroxybenzoic acid and 2,2'-methylenebis(6-t-butyl-p-cresol) and nitrophenols such as 2,4-dinitrophenol, o-nitrophenol, m-nitrophenol and p-nitrophenol. Particularly, the above phenols are preferred in aspects of stability and safety.

Although oxygen, of course, exhibits a radical-inhibiting effect, pressurizing of an organic solution with oxygen is very dangerous because of a possibility of explosion and the amount of oxygen which can be dissolved in a solution is limited. Therefore, the use of oxygen is not preferred.

According to the present invention, the addition of a radical inhibitor is carried out with the purpose of preventing the fluoroalkyl α-chloroacrylate polymer or copolymer from decomposing in its solution with the lapse of time, so that it is essentially different in the purpose from the addition of a polymerization inhibitor which is carried out with the purpose of protecting a polymerizable group of a polymer.

Further, the addition of a radical inhibitor according to the present invention does not aim at modifying nor improving the coated resist film, because no radical inhibitor remains intact in the coated film after prebaking. That is to say, although the polymer according to the present invention is radically decomposed in its solution, it is stable for a long period of time in a state of powder or coated resist film.

The amount of the radical inhibitor to be added in the present invention is generally 0.01 to 5% by weight, preferably 0.1 to 2% by weight, based on the amount of the copolymer to be used.

Now, a preferred process for preparing the resist of the present invention will be described, though it is not limitative.

The copolymer comprising 2,2,2-trifluoroethyl α-chloroacrylate and 2,2,3,3-tetrafluoropropyl α-chloroacrylate according to the present invention is ordinarily prepared preferably by precipitation polymerization without stirring in the presence of a radical polymerization initiator. That is to say, the polymerization is carried out without stirring in a solvent which can dissolve the monomers but cannot dissolve the resulting copolymer.

According to the precipitation polymerization, the copolymer according to the present invention can be prepared with excellent reproducibility of molecular weight and yield and without formation of gels which are observed in the case of bulk polymerization or solution polymerization, and the polymerization time can be shortened to a third to twentieth of that of solution polymerization.

The polymerization solvent to be used in the present invention may be any one which is miscible with the monomers but does not dissolve the resulting copolymer. Examples of the solvent include lower alcohols such as methanol, ethanol, isopropanol, n-propanol, n-butanol, isobutanol and t-butanol; hydrocarbons such as petroleum ether, petroleum benzine, n-pentane, n-hexane, n-heptane and cyclohexane; aromatic hydrocarbons such as benzene, toluene, xylene and ethylbenzene and halogenated hydrocarbons such as dichloromethane, chloroform, dichloroethane, trichloroethane and trichloroethylene.

The amount of the solvent is 1 to 20 times, preferably 2 to 10 times that of the monomers. Though the use of a smaller amount of the solvent gives a shorter polymerization time, it brings about remarkable generation of heat to result in difficult control of the polymerization.

The above polymerization process is carried out without stirring, so that the removal of heat of polymerization should be particularly considered. When the polymerization is carried out by a large scale in a usual reactor, the surface area per unit volume is smaller than that of the smaller case, so that the temperature at the central part of the reactant abnormally increases during the polymerization. Therefore, it is preferred to use a reactor having a heat transfer area per unit volume of the reactant which is larger than a specified value. The heat transfer area per unit volume of the reactant is generally at least 0.1 cm$^2$/cm$^3$, preferably at least 0.2 cm$^2$/cm$^3$. The material of the reactor may be stainless steel, titanium, glass lining steel, glass or the like. The overall coefficient of heat transfer of the reactor as determined with water is at least 30, preferably at least 50.

To attain a heat transfer area per unit volume of the reactant which is larger than a specified value, the shape of the reactor is not particularly resiricted and the reactor may take the form of, for example, pipe or rectangular parallelepiped, or it may be provided with a radiator coil or a radiator plate therein. Alternatively, a relatively small amount of the reactant may be placed in a relatively large reactor to thereby attain a suitable heat transfer area.

Although slight ununiformness of temperature in a reactor can not be avoided because the polymerization is carried out without stirring, it is preferred that the ununiformity of in the temperature is controlled within 15° C., still preferably within 10° C. or below.

The polymerization temperature may be generally 30° to 90° C., preferably 40° to 70° C., though it, of course, varies depending upon the kind of an initiator or a solvent.

It is a matter of course that the reaction time varies depending upon reaction conditions such as polymerization temperature or the kind and amount of an initiator, a solvent and monomers. The reaction time is generally 2 to 30 hours, preferably 5 to 20 hours. Further, it is preferred that the reaction time is selected so as to give a polymerization yield of 90 to 97%.

The radical polymerization initiator to be used in the above polymerization is not particularly limited and may be any one which is generally used in a usual radical polymerization. Preferred examples of the radical polymerization initiator include diacyl peroxides such as diacetyl peroxide, dipropionyl peroxide, dibutyryl peroxide and dibenzoyl peroxide and azobis compounds such as 2,2′-azobis(propionitrile), 2,2′-azobis(butyronitrile), 2,2′-azobis(valeronitrile), 2,2′-azobis(3-methylbutyronitrile), 2,2′-azobis(2-methylpropionitrile), 2,2′-azobis(methyl 2-methylpropionate), 1,1′-azobis(1-phenylethane) and azobisdiphenylmethane.

The amount of the polymerization initiator is generally 0.01 to 0.10 part by weight, preferably 0.02 to 0.06 part by weight, based on the total amount of the monomers.

According to the present invention, it is preferred that the copolymer has an intrinsic viscosity as determined in methyl ethyl ketone at 25° C. of 0.5 to 2.0 and a solution viscosity as determined in methyl cellosolve acetate at 25° C. with a concentration of 5% of 20 to 70 cP. The intrinsic viscosity and the solution viscosity vary depending upon various factors such as polymerization temperature, polymerization time, the amount and kind of a polymerization initiator or a polymerization solvent or the shape of a reactor. Accordingly, the intrinsic viscosity and the solution viscosity can be controlled by experimentally determining suitable conditions.

It has been found by the inventors of the present invention that the intrinsic viscosity and the solution viscosity of the polymer are in a relationship represented by the following formula:

$$\log \eta = 0.631 + K[\eta]$$

wherein [$\eta$] is an intrinsic viscosity of the polymer as determined in methyl ethyl ketone at 25° C. and $\eta$ is a solution viscosity of the polymer as determined in methyl cellosolve acetate at 25° C. with a concentration of 5%.

Although the K value varies depending upon the monomer composition of the copolymer or polymerization conditions, it is preferred in an aspect of the resolution of the obtained resist pattern that the copolymer has a K value of 0.90 to 0.65.

After the polymerization, the precipitated polymer powder is filtered, washed and dried. Alternatively, it may be dissolved in a solvent and reprecipitated in a nonsolvent, followed by filtration, washing and drying.

The resist composition is prepared by dissolving the obtained copolymer, preferably, with a radical inhibitor in a suitable solvent and filtering the solution through a membrane filter having a pore size of 0.2 to 0.45$\mu$.

The copolymer according to the present invention may further contain other monomer(s) as the comonomer component to thereby improve the performance of the copolymer. For example, when it further contains an aromatic monomer as the comonomer component, the resistance to dry etching can be improved. Examples of the aromatic monomer to be copolymerized include aromatic vinyl compounds having 8 to 15 carbon atoms, such as styrene, $\alpha$-methylstyrene, vinylnaphthalene, vinylpyridine and vinylcarbazol; their derivatives having a substituent on their aromatic ring; acrylic aromatic compounds having 9 to 15 carbon atoms, such as benzyl acrylate, phenyl acrylate, benzyl $\alpha$-chloroacrylate, phenyl $\alpha$-chloroacrylate, benzyl methacrylate and phenyl methacrylate and their derivatives having a substituent on their aromatic ring.

Further, when the copolymer according to the present invention further contains a monomer which has a carboxyl group as the comonomer component, the adhesion to a substrate can be improved. Examples of the carboxyl-containing monomer to be copolymerized include polymerizable unsaturated carboxylic acids such as acrylic, methacrylic, 2-chloroacrylic, itaconic and 2-cyanoacrylic acids.

A solution of a three component copolymer comprising 2,2,2-trifluoroethyl $\alpha$-chloroacrylate, 2,2,3,3-tetrafluoropropyl $\alpha$-chloroacrylate and methacrylic acid in MCA exhibits a lower solution viscosity than that of a solution of a copolymer only comprising 2,2,2-trifluoroethyl a-chloroacrylate and 2,2,3,3-tetrafluoropropyl $\alpha$-chloroacrylate and having the same intrinsic viscosity as that of the three component copolymer. Said three component copolymer will be described in Examples. The solution viscosity of a 5% by weight solution of the terpolymer in MCA is preferably 20 to 50 cP.

The radiation-sensitive positive resist and the composition containing the same prepared by the above process are suitably used not only in the production of photo masks with electron beam exposure systems, but also in various fine processing by wet etching.

Further, the resist and the resist composition according to the present invention has also a sensitivity to deep-ultraviolet radiation or soft X-ray, so that they can be used in exposure with these electromagnetic waves.

MEASUREMENT OF CHARACTERISTICS AND EVALUATION OF EFFECTS

Now, a process for measuring the sensitivity of the radiation-sensitive positive resist according to the present invention will be described.

A polymer is dissolved in a suitable solvent such as MCA. The obtained solution is filtered through a membrane filter having a pore size of 0.2 to 0.45μ to obtain a resist solution. This resist solution is applied on a substrate with a spinner to form a uniform resist film having a thickness of 0.4 to 1.0μ. The resist film is pre-baked to remove the solvent and enhance the adhesion to the substrate. According to the present invention, the radiation-sensitive positive resist is preferably pre-baked at 160° to 210° C. for 15 minutes to one hour.

The substrate is exposed by the use of an electron beam exposure system with a specified current intensity and a specified exposure area, while changing the exposure time in geometrical progression, thus forming 10 to 20 exposed areas. The quantity of electricity per unit area ($\mu C/cm^2$) of each exposed area is determined based on the area, the current intensity and the exposure time.

The substrate is dipped in a suitable developer at a suitable temperature for a suitable time, rinsed in a non-solvent such as isopropanol, dried and post-baked. It is generally preferred that the post-baking is carried out at a temperature lower than the glass transition temperature of the polymer.

The each film thickness of the exposed area and the unexposed area on the substrate is measured with a surface roughness meter. The results are plotted with the quantity of electricity (dose) as abscissa and the film thickness of the exposed area as ordinate to form a sensitivity curve. The term "sensitivity" as used in the present invention refers to a value at which the sensitivity curve crosses the ordinate.

Also the film thickness before the development is measured and compared with that after the exposure to determine the difference between the both. The term "thickness loss" used in the present invention refers to this difference.

Generally, in the exposed area of a radiation-sensitive positive resist, scission of the main chain of the polymer is caused to lower the molecular weight thereof. Therefore, when the exposed resist is developed, the polymer of the exposed area is dissolved faster than that of the unexposed area, thus forming a resist pattern. In this development, the film thickness of the unexposed area is also reduced.

The sensitivity of a radiation-sensitive positive resist varies depending upon the kind of developer, temperature, development time or the film thickness of a resist, so that the description of sensitivity not accompanied with these data is meaningless. Actually, when development is carried out at a high temperature for a long time, the thickness loss of the unexposed area is increased, though the sensitivity is seemingly high.

EXAMPLE 1

70 g of 2,2,2-trifluoroethyl α-chloroacrylate, 30 g of 2,2,3,3-tetrafluoropropyl α-chloroacrylate, 3.40 g of azobisisobutyronitrile and 400 ml of t-butanol were placed in a 2-l three-necked flask and dissolved by stirring. The flask was purged with nitrogen and allowed to stand in a water bath of 50° C. for 7 hours.

The obtained gelatinous mass was dissolved in 1 l of acetone to obtain a solution. This solution was poured into a mixture of 4 l of methanol and 2 l of water to cause precipitation. The precipitate was filtered, washed with a methanol-water mixture (2:1) and dried in a vacuum oven.

95.3 g of a polymer powder was obtained (yield: 95%). This polymer exhibited an intrinsic viscosity of 1.22 in methyl ethyl ketone at 25° C. and a 5% solution of the polymer in MCA exhibited a solution viscosity of 37 cP.

Results of elemental analysis of the polymer are as follows:

|  | C (%) | H (%) | Cl (%) | F (%) |
| --- | --- | --- | --- | --- |
| calculated: | 32.10 | 2.19 | 17.98 | 31.50 |
| observed: | 32.22 | 2.36 | 18.01 | 31.40 |

The following experiments were conducted by using the above polymer powder.

(A) 500 g of the polymer powder was dissolved in 8120 g of a solvent mixture comprising MCA and methanol at a weight ratio of 9 to 1. The obtained solution was filtered through a membrane filter having a pore size of 0.2μ under pressurizing with nitrogen and filled in 1-l glass bottles each in a 1-l portion. The sensitivity of the polymer to electron beams was determined as follows:

The resist solution was applied on chromium blanks by spin coating at 1000 r.p.m. and pre-baked at 200° C. for 30 minutes. The obtained resist film had a thickness of 5600 Å.

The resist film was scan-exposed with an electron beam exposure system (a product of Elionix Co.; ERE-301) with an exposure area of 0.45×0.6 mm, an accelerating voltage of 20 kV and a current intensity of 1 nA, while changing the exposure time successively.

The resulting substrate was dipped in a developer comprising methyl isobutyl ketone and isopropanol at a weight ratio of 80 to 20 under stirring at 25° C. for 3 or 5 minutes and dipped in isopropanol for 30 seconds.

The unexposed area and the exposed area were examined for film thickness successively to form a sensitivity curve. When the development time was 3 minutes, the sensitivity was 3.2 $\mu C/cm^2$ and the thickness loss of the unexposed area was 150 Å, while when the development time was 5 minutes, the sensitivity was 1.5 $\mu C/cm^2$ and the thickness loss thereof was 260 Å.

The bottled resist solution was preserved at a room temperature for 20 days. The solution viscosity decreased to 20 cP from the initial value of 47 cP.

(B) 500 g of the polymer powder and 5.0 g of 2,6-di-t-butyl-p-cresol (BHT) were dissolved in 8120 g of a solvent mixture comprising MCA and methanol at a weight ratio of 9 to 1. The obtained solution was filtered through a membrane filter having a pore size of 0.2μ under pressurizing with nitrogen and filled in 1-l glass bottles each in a 1-l portion.

The sensitivity of the obtained resist was determined in a similar manner to that described in the above experiment (A).

The resist solution was applied on chromium blanks by spin coating at 1000 r.p.m. and pre-baked at 200° C. for 30 minutes to form a resist film having a thickness of 5580 Å.

The resist film was scan-exposed with an electron beam exposure system (a product of Elionix Co.; ERE-301) under conditions of an exposure area of 0.45×0.6 mm, an accelerating voltage of 20 kV and a current intensity of 1 nA, while changing the exposure time successively. The resulting substrate was dipped in a developer comprising methyl isobutyl ketone and isopropanol at a weight ratio of 80 to 20 under stirring at 25° C. for 3 or 5 minutes and dipped in isopropanol for 30 seconds.

The unexposed area and the exposed area were examined for film thickness successively to form a sensitivity curve. When the development time was 3 minutes, the sensitivity was 3.2 $\mu C/cm^2$ and the thickness loss of the unexposed area was 160 Å, while when the development time was 5 minutes, the sensitivity was 1.5 $\mu C/cm^2$ and the thickness loss thereof was 250 Å. These data with respect to sensitivity and thickness loss were substantially equal to those obtained in the experiment (A).

The resist solution was applied on a quartz plate having a thickness of 1 mm by spin coating at 1000 r.p.m. and examined for absorption in the ultraviolet region by the use of a spectrophotometer. The absorption of 2,6-di-t-butyl-p-cresol was observed.

The resulting quartz plate was pre-baked at 200° C. for 30 minutes and examined for absorption in the ultraviolet region again. The absorption of 2,6-di-t-butyl-p-cresol disappeared, so that the absorption characteristics were equal to those of a sample obtained by spin coating with the same resist solution as that used in the experiment (A) and pre-baking the coating film.

Some of the above bottles containing the resist solution were preserved at a room temperature for one year, while the others of them were preserved at 50° C. for 2 months. None of them caused any changes in solution viscosity. A sample was prepared by spin coating of chromium blanks with the resist solution at 1000 r.p.m. and pre-baking the resulting coating film at 200° C. for 30 minutes to form a resist film having a thickness of 5570 Å.

One micron line and space was exposed with Gaussian beams of 0.25$\mu$ by the use of the same electron beam exposure system as that used above. The exposed plate was dipped in a developer comprising methyl isobutyl ketone and isopropanol at a weight ratio of 80 to 20 under stirring at 25° C. for 5 minutes and dipped in isopropanol for 30 seconds.

The obtained resist pattern exhibited an accuracy equal to that of EBR-9 and caused neither peeling-off nor swelling.

The resulting plate was post-baked at 100° C. for 30 minutes and subjected to descumming under the condition of 1 Torr and 100 W in an air plasma containing moisture for 1 minute by the use of a barrel type plasma etching apparatus.

The treated plate was dipped in an etchant essentially comprising cerium ammonium nitrate and perchloric acid at 23° C. for 40 seconds.

The obtained pattern exhibited an accuracy equal to that of EBR-9 with little side etch.

COMPARATIVE EXAMPLE 1

An example using poly-2,2,2-trifluoroethyl α-chloroacrylate (EBR-9) will be described as a comparative example. A commercially available one exhibits an intrinsic viscosity of 1.00 in methyl ethyl ketone and a 5% solution thereof in MCA exhibits a solution viscosity of 30 cP. The resist was developed in a methyl isobutyl ketone (MIBK)-isopropanol (IPA) mixture at 25° C. for 3 or 5 minutes. The thickness loss and the sensitivity will be shown below. The initial film thickness was 5500 Å. The other conditions were the same as those used in Example 1.

| MIBK:IPA | Development time (minute) | Thickness loss (Å) | Sensitivity ($\mu C/cm^2$) |
| --- | --- | --- | --- |
| 80:20 | 3 | 50 | 9.4 |
|  | 5 | 90 | 4.6 |
| 89:11 | 3 | 160 | 6.2 |
|  | 5 | 370 | 3.2 |
| 100:0 | 3 | 330 | 4.3 |
|  | 5 | 690 | 2.4 |

The above data with respect to the same development time were plotted with the thickness loss as ordinate and the sensitivity as abscissa to obtain a curve as shown in FIG. 1. This curve shows the sensitivity level of EBR-9. Accordingly, if a curve formed by plotting the data of sensitivity and thickness loss with respect to a new resist is below the above curve, the resist is more highly sensitive than EBR-9.

In FIG. 1, the curve 1 is a sensitivity of the case wherein the development time was 3 minutes, while the curve 2 is a sensitivity of the case wherein the development time was 5 minutes. In each of the curves, the rightmost point corresponds to the case wherein a developer exclusively comprising methyl isobutyl ketone was used and the middle point corresponds to the case wherein a developer comprising 89% by weight of methyl isobutyl ketone and 11% by weight isopropanol was used, while the leftmost point corresponds to the case wherein a developer comprising 80% by weight of methyl isobutyl ketone and 20% by weight of isopropanol was used.

EXAMPLES 2 to 6

Several resist compositions were prepared by the same procedure as that described in Example 1.

The measured sensitivity significantly varied depending upon thickness loss. Further, the thickness loss itself varied in every measurement, so that it is meaningless to compare the absolute value of sensitivity.

Therefore, the sensitivity of EBR-9 observed in the case wherein EBR-9 exhibited the same thickness loss as the one measured above was determined based on the data obtained in Comparative Example 1 and are shown in the rightmost column.

| Ex. No. | Monomer (g) TFECA | TFPCA | MA | AIBN (g) | t-BuOH (ml) | Polymn. time | Yield (%) | lower: observed [η] | η | Elemental analysis upper: calculated C (%) | H (%) | Cl (%) | F (%) |
| --- | --- | --- | --- | --- | --- | --- | --- | --- | --- | --- | --- | --- | --- |
| 2 | 80 | 20 |  | 3.30 | 400 | 7 | 96 | 1.25 | 44 | 32.02 | 2.17 | 18.25 | 31.07 |
|  |  |  |  |  |  |  |  |  |  | 32.27 | 2.01 | 18.46 | 31.11 |
| 3 | 75 | 25 |  | 3.30 | 400 | 7 | 96 | 1.22 | 42 | 32.06 | 2.18 | 18.12 | 31.29 |
|  |  |  |  |  |  |  |  |  |  | 32.15 | 2.09 | 17.94 | 31.09 |
| 4 | 60 | 40 |  | 3.00 | 400 | 7 | 94 | 1.35 | 42 | 32.18 | 2.20 | 17.71 | 31.92 |

-continued

| | | | | | | | | | | | | | |
|---|---|---|---|---|---|---|---|---|---|---|---|---|---|
| | | | | | | | | | | 32.36 | 2.10 | 17.54 | 31.89 |
| 5 | 69 | 30 | 1 | 4.40 | 400 | 7 | 95 | 1.22 | 28 | 32.34 | 2.24 | 17.79 | 31.20 |
| | | | | | | | | | | 32.16 | 2.30 | 17.87 | 31.32 |
| 6 | 68 | 30 | 2 | 4.40 | 400 | 7 | 95 | 1.18 | 26 | 32.58 | 2.29 | 17.60 | 30.90 |
| | | | | | | | | | | 32.76 | 2.40 | 17.44 | 30.99 |

| Developer MIBK:IPA (weight ratio) | Film thickness (Å) | Thickness loss (Å) | Development time (min) | Sensitivity $\mu C/cm^2$ | EBR-9 |
|---|---|---|---|---|---|
| 80:20 | 5600 | 80 | 3 | 4.1 | 8.1 |
| " | | 150 | 5 | 2.4 | 4.2 |
| 90:10 | 5570 | 150 | 3 | 3.0 | 6.3 |
| " | | 310 | 5 | 1.3 | 3.5 |
| 80:20 | 5590 | 130 | 3 | 3.3 | 6.7 |
| " | | 240 | 5 | 1.6 | 3.7 |
| 90:10 | 5580 | 320 | 3 | 2.0 | 4.3 |
| " | | 590 | 5 | 0.7 | 2.6 |
| 80:20 | 5610 | 140 | 3 | 2.5 | 6.4 |
| " | | 290 | 5 | 1.2 | 4.5 |
| 90:10 | 5550 | 350 | 3 | 1.2 | 4.2 |
| " | | 750 | 5 | 0.35 | 2.3 |
| 70:30 | 5550 | 110 | 3 | 3.2 | 7.2 |
| " | | 180 | 5 | 1.7 | 4.1 |
| 80:20 | 5580 | 220 | 3 | 1.6 | 5.2 |
| " | | 410 | 5 | 0.52 | 3.1 |
| 60:40 | 5590 | 80 | 3 | 3.5 | 8.2 |
| " | | 160 | 5 | 1.9 | 4.2 |
| 70:30 | 5490 | 310 | 3 | 1.8 | 4.4 |
| " | | 540 | 5 | 0.55 | 2.7 |

TFECA: 2,2,2-trifluoroethyl α-chloroacrylate
TFPCA: 2,2,3,3-tetrafluoropropyl α-chloroacrylate
MA: methacrylic acid
AIBN: azobisisobutyronitrile
t-BuOH: t-butanol
[η]intrinsic viscosity in methyl ethyl ketone at 25° C.
η: solution viscosity of 5% MCA solution
MIBK: methyl isobutyl ketone
IPA: isopropanol
Development temperature: 25° C.
The coating solvent comprised MCA and methanol at a ratio of 9 to 1. One % by weight (based on the polymer) of BHT was added.

COMPARATIVE EXAMPLE 2

40 g of 2,2,2-trifluoroethyl α-chloroacrylate, 60 g of 2,2,3,3-tetrafluoropropyl α-chloroacrylate, 3.40 g of azobisisobutyronitrile and 400 ml of t-butanol were placed in a 2-l three-necked flask and dissolved by stirring. The flask was purged with nitrogen and allowed to stand in a water bath of 50° C. for 7 hours.

The obtained gelatinous mass was dissolved in 1 l of acetone to obtain a solution. This solution was poured into a mixture comprising 4 l of methanol and 2 l of water to cause precipitation. The precipitate was filtered, washed with a solvent mixture comprising methanol and water at a ratio of 2 to 1 and dried in a vacuum oven.

95.0 g of polymer powder was obtained (yield: 95%). This polymer exhibited an intrinsic viscosity of 1.45 in methyl ethyl ketone at 25° C. and a 5% solution thereof in MCA exhibited a solution viscosity of 43 cP.

Results of elemental analysis thereof are as follows:

| | C (%) | H (%) | Cl (%) | F (%) |
|---|---|---|---|---|
| calculated: | 32.35 | 2.23 | 17.16 | 32.77 |
| observed: | 32.34 | 2.29 | 17.34 | 32.51 |

The following experiment was carried out by using the polymer powder prepared by the above process.

50 g of the polymer powder and 0.5 g of BHT were dissolved in 617 g of a solvent mixture comprising MCA and methanol at a weight ratio of 95 to 5, filtered through a membrane filter having a pore size of 0.2μ under pressurizing with nitrogen to obtain a resist solution.

This resist solution was applied on chromium blanks by spin coating at 3000 r.p.m. and pre-baked at 200° C. for 30 minutes to form a resist film having a thickness of 5600 Å.

This resist film was scan-exposed with an electron beam exposure system under conditions of an exposure area of 0.45×0.6 mm, an accelerating voltage of 20 kV and a current intensity of 1 nA, while changing the exposure time successively.

The resulting substrate was dipped in a developer comprising methyl ethyl ketone and isopropanol at a weight ratio of 70 to 30 under stirring at 25° C. for 3 or 5 minutes and in isopropanol for 30 seconds successively.

The unexposed area and the exposed area were examined for film thickness to form a sensitivity curve. When the development time was 3 minutes, the sensitivity was 1.7 μC/cm² and the thickness loss of the unexposed area was 180 Å, while when the development time was 5 minutes, the sensitivity was 1.2 μC/cm² and the thickness loss of the unexposed area was 340 Å. A sample was prepared by spin coating of chromium blanks with the above resist solution at 3000 r.p.m. and pre-baking the resulting coating film at 200° C. for 30 minutes to form a resist film of a thickness of 5590 Å. One micron line and space was exposed with Gaussian beams of 0.25μ by using the same electron beam exposure system as that used above. The exposed plate was dipped in a developer comprising methyl isobutyl ketone and isopropanol at a weight ratio of 70 to 30 at 25° C. for 5 minutes and dipped in isopropanol for 30 seconds.

The obtained resist pattern showed swelling and partially peeled off.

The radiation-sensitive positive resist according to the present invention exhibits high sensitivity and excellent reproducibility, so that it serves to enhance productivity in the production of photo masks.

Further, even when the resist is preserved in the form of a solution for a long period of time, no changes in the properties occur. Therefore, when the resist solution which has been preserved is re-used, the solution can always give a film having a suitable thickness on a substrate to form an excellent resist pattern economically advantageously with good producibility.

We claim:

1. A radiation-sensitive positive resist comprising a copolymer obtained by copolymerizing 2,2,2-trifluoroethyl α-chloroacrylate with 2,2,3,3-tetrafluoropropyl α-chloroacrylate at a weight ratio of between 90:10 and 50:50.

2. A radiation-sensitive positive resist as set forth in claim 1, wherein said resist comprises a copolymer obtained by copolymerizing 2,2,2-trifluoroethyl α-chloroacrylate with 2,2,3,3-tetrafluoropropyl α-chloroacrylate at a weight ratio of between 80:20 and 60:40.

3. A radiation-sensitive positive resist as set forth in claim 1, wherein the intrinsic viscosity of the copolymer as determined in methyl ethyl ketone at 25° C. is 0.5 to 2.0.

4. A radiation-sensitive positive resist as set forth in claim 1, wherein the intrinsic viscosity of the copolymer as determined in methyl ethyl ketone at 25° C. is 1.0 to 1.5.

5. A radiation-sensitive positive resist as set forth in claim 1, wherein the solution viscosity of a 5% solution of the copolymer in methyl cellosolve acetate is 20 to 70 cP.

6. A radiation-sensitive positive resist as set forth in claim 1, wherein the solution viscosity of a 5% solution of the copolymer in methyl cellosolve acetate is 30 to 60 cP.

7. A radiation-sensitive positive resist composition essentially comprising a copolymer obtained by copolymerizing 2,2,2-trifluoroethyl α-chloroacrylate with 2,2,3,3-tetrafluoropropyl α-chloroacrylate at a weight ratio of between 90:10 and 50:50 and a solvent containing methyl cellosolve acetate as a major component.

8. A radiation-sensitive positive resist composition as set forth in claim 7, wherein the solvent contains at least 70% by weight of methyl cellosolve acetate.

9. A radiation-sensitive positive resist composition as set forth in claim 7, wherein the solvent is a mixture of methyl cellosolve acetate and methanol.

10. A radiation-sensitive positive resist composition as set forth in claim 7, wherein the solvent is a mixture of methyl cellosolve acetate and methanol and the methanol content of the mixture is 5 to 20% by weight.

11. A radiation-sensitive positive resist composition as set forth in claim 7, wherein said composition further contains a radical inhibitor.

12. A radiation-sensitive positive resist composition as set forth in claim 11, wherein said radical inhibitor has a molecular weight of 600 or below.

13. A radiation-sensitive positive resist composition as set forth in claim 11, wherein said radical inhibitor is one which vaporises by pre-baking at 160° to 210° C. to be substantially removed from the composition.

14. A radiation-sensitive positive resist composition as set forth in claim 11, wherein the amount of a radical inhibitor is 0.01 to 5% by weight based on the copolymer.

15. A radiation-sensitive positive resist composition as set forth in claim 11, wherein the amount of a radical inhibitor is 0.1 to 2% by weight based on the copolymer.

* * * * *

UNITED STATES PATENT AND TRADEMARK OFFICE
CERTIFICATE OF CORRECTION

PATENT NO. : 4,800,151

DATED : January 24, 1989

INVENTOR(S) : Mutsuo KATAOKA et al

It is certified that error appears in the above-identified patent and that said Letters Patent is hereby corrected as shown below:

Column 5, line 15, "resiricted" should read --restricted--.

Column 6, line 54, "a-chloroacrylate" should read --α-chloroacrylate--.

Column 7, line 49 "exposure" should read --post bake--.

Columns 9 and 10, lines 3 and 4 of the Table, "lower:   "
observed should read --lower:observed--.

Columns 11 and 12, the table should appear as shown on the attached page.

UNITED STATES PATENT AND TRADEMARK OFFICE
CERTIFICATE OF CORRECTION

PATENT NO. : 4,800,151
DATED : January 24, 1989
INVENTOR(S) : Mutsuo KATAOKA et al It is certified that error appears in the above-identified patent and that said Letters Patent is hereby corrected as shown below:

11

-continued

|   |    |    |   |      |     |   |    |      |    | 32.36 | 2.10 | 17.54 | 31.89 |
|---|----|----|---|------|-----|---|----|------|----|-------|------|-------|-------|
| 5 | 69 | 30 | 1 | 4.40 | 400 | 7 | 95 | 1.22 | 28 | 32.34 | 2.24 | 17.79 | 31.20 |
|   |    |    |   |      |     |   |    |      |    | 32.16 | 2.30 | 17.87 | 31.32 |
| 6 | 68 | 30 | 2 | 4.40 | 400 | 7 | 95 | 1.18 | 26 | 32.58 | 2.29 | 17.60 | 30.90 |
|   |    |    |   |      |     |   |    |      |    | 32.76 | 2.40 | 17.44 | 30.99 |

12

| Ex. No. | Developer MIBK:IPA (weight ratio) | Film thickness (Å) | Thickness loss (Å) | Development time (min) | Sensitivity μC/cm² | EBR-9 |
|---------|-----------------------------------|--------------------|--------------------|------------------------|--------------------|-------|
| 2 | 80:20 | 5600 | 80  | 3 | 4.1  | 8.1 |
|   | "     |      | 150 | 5 | 2.4  | 4.2 |
|   | 90:10 | 5570 | 150 | 3 | 3.0  | 6.3 |
|   | "     |      | 310 | 5 | 1.3  | 3.5 |
| 3 | 80:20 | 5590 | 130 | 3 | 3.3  | 6.7 |
|   | "     |      | 240 | 5 | 1.6  | 3.7 |
|   | 90:10 | 5580 | 320 | 3 | 2.0  | 4.3 |
|   | "     |      | 590 | 5 | 0.7  | 2.6 |
| 4 | 80:20 | 5610 | 140 | 3 | 2.5  | 6.4 |
|   | "     |      | 290 | 5 | 1.2  | 4.5 |
|   | 90:10 | 5550 | 350 | 3 | 1.2  | 4.2 |
|   | "     |      | 750 | 5 | 0.35 | 2.3 |
| 5 | 70:30 | 5550 | 110 | 3 | 3.2  | 7.2 |
|   | "     |      | 180 | 5 | 1.7  | 4.1 |
|   | 80:20 | 5580 | 220 | 3 | 1.6  | 5.2 |
|   | "     |      | 410 | 5 | 0.52 | 3.1 |
| 6 | 60:40 | 5590 | 80  | 3 | 3.5  | 8.2 |
|   | "     |      | 160 | 5 | 1.9  | 4.2 |
|   | 70:30 | 5490 | 310 | 3 | 1.8  | 4.4 |
|   | "     |      | 540 | 5 | 0.55 | 2.7 |

Signed and Sealed this

Eighth Day of August, 1989

Attest:

DONALD J. QUIGG

*Attesting Officer*   *Commissioner of Patents and Trademarks*